United States Patent
Yarnykh

(10) Patent No.: US 8,369,599 B2
(45) Date of Patent: Feb. 5, 2013

(54) FAST TWO-POINT MAPPING OF THE BOUND POOL FRACTION AND CROSS-RELAXATION RATE CONSTANT FOR MRI

(75) Inventor: Vasily Yarnykh, Seattle, WA (US)

(73) Assignee: University of Washington, Seattle, WA (US)

(*) Notice: Subject to any disclaimer, the term of this patent is extended or adjusted under 35 U.S.C. 154(b) by 674 days.

(21) Appl. No.: 12/594,784

(22) PCT Filed: May 15, 2008

(86) PCT No.: PCT/US2008/063750
§ 371 (c)(1),
(2), (4) Date: Oct. 5, 2009

(87) PCT Pub. No.: WO2008/144421
PCT Pub. Date: Nov. 27, 2008

(65) Prior Publication Data
US 2010/0142784 A1  Jun. 10, 2010

Related U.S. Application Data

(60) Provisional application No. 60/938,664, filed on May 17, 2007.

(51) Int. Cl.
*A61B 6/03* (2006.01)
(52) U.S. Cl. ........................................ 382/131
(58) Field of Classification Search .......... 324/300–322; 382/128–132
See application file for complete search history.

(56) References Cited

U.S. PATENT DOCUMENTS

| | | | |
|---|---|---|---|
| 5,050,609 A | 9/1991 | Balaban et al. | 128/653 CA |
| 5,051,698 A | 9/1991 | Ordidge | 324/309 |
| 5,256,967 A | 10/1993 | Foo et al. | 324/311 |
| 5,285,158 A | 2/1994 | Mistretta et al. | 324/309 |
| 5,588,431 A | 12/1996 | Mani et al. | 128/653.3 |
| 5,810,728 A | 9/1998 | Kuhn | 600/410 |
| 5,908,386 A | 6/1999 | Ugurbil et al. | 600/410 |
| 6,320,377 B1 | 11/2001 | Miyazaki et al. | 324/306 |
| 6,486,886 B1 | 11/2002 | Silverbrook et al. | 324/307 |
| 6,493,569 B2 | 12/2002 | Foo et al. | 600/420 |
| 6,498,946 B1 | 12/2002 | Foo et al. | 600/410 |
| 6,552,542 B1 | 4/2003 | Overall | 324/309 |
| 6,943,033 B2 | 9/2005 | Van Zijl et al. | 436/173 |
| 7,412,277 B1 | 8/2008 | Saranathan et al. | 600/413 |
| 7,498,808 B2 | 3/2009 | Asano | 324/307 |
| 7,546,155 B2 | 6/2009 | Foo et al. | 600/410 |
| 7,627,359 B2 | 12/2009 | Yarnykh et al. | 600/410 |

(Continued)

OTHER PUBLICATIONS

Yarnykh et al., Cross-relaxation imaging reveals detailed anatomy of white matter fiber tracts in the human brain, 2004, NeuroImage, p. 409-424.*

(Continued)

*Primary Examiner* — Toan Ton
*Assistant Examiner* — John Corbett
(74) *Attorney, Agent, or Firm* — Kilpatrick Townsend & Stockton LLP

(57) ABSTRACT

A two-point reconstruction technique provides an efficient clinical method for measuring parametric bound pool fraction and cross-relaxation rate constant spatial distributions in biological objects from two experimental measurements based on magnetization transfer effect obtained in magnetic resonance imaging (MRI). The method is based on linearization of an analytical pulsed magnetization transfer mathematical model so that spatial distribution maps of the bound pool fraction and cross-relaxation rate constant can be obtained in a time-efficient manner by using only two experimental magnetization transfer images of the bio-logical object in which water and macromolecules are present.

51 Claims, 7 Drawing Sheets

U.S. PATENT DOCUMENTS

| | | | |
|---|---|---|---|
| 7,672,704 | B2 | 3/2010 | Viglianti et al. ............... 600/407 |
| 2006/0080044 | A1 | 4/2006 | Ropele ............................ 702/23 |
| 2007/0032956 | A1 | 2/2007 | Blanz et al. .................... 324/303 |

OTHER PUBLICATIONS

Bakshi, "Magnetic Resonance Imaging Advances in Multiple Sclerosis." *Journal of Neuroimaging* Supplement to vol. 15, No. 4: 5S-9S, 2005.

Gochberg et al., "Quantitative Magnetization Transfer Imaging via Selective Inversion Recovery with Short Repetition Times." *Magnetic Resonance in Medicine* vol. 57: 437-441, 2007.

Henkelman et al., "Magnetization Transfer in MRI: a review." *NMR in Biomedicine* vol. 14: 57-64, 2001.

Ropele et al., "Method for Quantitative Imaging of the Macromolecular $^1$H Fraction in Tissues." *Magnetic Resonance in Medicine* vol. 49: 864-871, 2003.

Sled et al. "Quantitative Imaging of Magnetization Transfer Exchange and Relaxation Properties in Vivo Using MRI." *Magnetic Resonance in Medicine* vol. 46: 923-931, 2001.

Tozer et al., "Quantitative Magnetization Transfer Mapping of Bound Protons in Multiple Sclerosis." *Magnetic Resonance in Medicine* vol. 50: 83-91, 2003.

Yarnykh et al., "Cross-relaxation imaging reveals detailed anatomy of white matter fiber tracts in the human brain." *NeuroImage*: 409-424, 2004.

Yarnykh, "Pulsed Z-Spectroscopic Imaging of Cross-Relaxation Parameters in Tissues for Human MRI: Theory and Clinical Applications." *Magnetic Resonance in Medicine* vol. 47: 929-939, 2002.

Bonk et al., "Time-of-Flight MR Angiography With Gd-DTPA Hexamethylene Diamine Co-Polymer Blood Pool Contrast Agent: Comparison of Enhanced MRA and Conventional Angiography for Arterial Stenosis Induced in Rabbits." *Journal of Magnetic Resonance Imaging*, vol. 11: 638-646, 2000.

Cai et al., "Classification of Human Carotid Atherosclerotic Lesions With In Vivo Multicontrast Magnetic Resonance Imaging." *Circulation, Journal of the American Heart Association*: 1368-1373, Sep. 10, 2002.

Chu et al., "Occurrence and Staging of Hemorrhage in the Advanced Carotid Atherosclerotic Plaque: An In-Vivo Multi Contrast High Resolution MRI Study." *Stroke*: 25pp., Oct. 2003.

Fayad et al., "Noninvasive In Vivo Human Coronary Artery Lumen and Wall Imaging Using Black-Blood Magnetic Resonance Imaging." *Circulation, Journal of the American Heart Association*, vol. 102: 506-510, 2000.

Han et al., "A Fast Minimal Path Active Contour Model." *IEEE Transactions On Image Processing*, vol. 10, No. 6: 865-873, Jun. 2001.

Han et al., "A Multi-Scale Method for Automatic Correction of Intensity Non-Uniformity in MR Images." *Journal of Magnetic Resonance Imaging*, vol. 13: 428-436, 2001.

Han et al., "Detecting Objects in Image Sequences Using Rule-Based Control in an Active Contour Model." *IEEE Transaction on Biomedical Engineering*, vol. 50, No. 6: 705-710, Jun. 2003.

Han et al., "Plaque Morphological Quantitation." *Angiography and Plaque Imaging, Advanced Segmentation Techniques*, Chapter 2: 43-76, 2003.

Hatsukami et al., "Visualization of Fibrous Cap Thickness and Rupture in Human Atherosclerotic Carotid Plaque In Vivo With High-Resolution Magnetic Resonance Imaging." *Circulation, Journal of the American Heart Association*: 959-964, Aug. 29, 2000.

Kaneko et al., "Detection of dissection and remodeling of atherosclerotic lesions in rabbits after balloon angioplasty by magnetic-resonance imaging." *Coronary Artery Disease, Diagnostic Methods*, vol. 11 No. 8.: 599-606, 2000.

Kang et al., "Analysis of the Measurement Precision of Arterial Lumen and Wall Areas Using High-Resolution MRI." Measurement Precision of High-Resolution MRI. *Magnetic Resonance in Medicine*, vol. 44: 967-972, 2000.

Kerwin et al., "A Quantitative Vascular Analysis System for Evaluation of Artherosclerotic Lesions by MRI." *Medical Imaging Computing and Computer-Assisted Intervention—MICCAI 2001*, 4th International Conference Utrecht, The Netherlands: 9pp., Oct. 2001.

Kerwin et al., "Analysis And Visualization Of Atherosclerotic Plaque Composition By MRI." *Angiography and Plaque Imaging, Advanced Segmentation Techniques*, Chapter 3: 77-177, 2003.

Kerwin et al., "Noise and Motion Correction in Dynamic Contrast-Enhanced MRI for Analysis for Athersclerotic Lesions." *Magnetic Resonance in Medicine*, vol. 47: 1211-1217, 2002.

Kerwin et al., "Quantitative Magnetic Resonance Imaging Analysis of Neovasculature Volume in Carotid Atherosclerotic Plaque." *Circulation, Journal of the American Heart Association*: 851-856, Feb. 18, 2003.

Kholmovski et al., "A Generalized k-Sampling Scheme for 3D Fast Spin Echo." *Journal of Magnetic Resonance Imaging*, vol. 11: 549-558, 2000.

Luo et al., "Accuracy and Uniqueness of Three In Vivo Measurements of Atherosclerotic Carotid Plaque Morphology With Black Blood MRI." *Magnetic Resonance in Medicine*, vol. 50: 75-82, 2003.

Mai et al., "Effect of Respiratory Phases on MR Lung Signal Intensity and Lung Conspicuity Using Segmented Multiple Iversion Recovery Turbo Spin Echo (MIR-TSE)." *Magnetic Resonance in Medicine*, vol. 43: 760-763, 2000.

Miller et al., "Atherosclerotic Plaque Imaging Techniques in Magnetic Resonance Images." *Angiography and Plaque Imaging, Advanced Segmentation Techniques*, Chapter 7: 299-329, 2003.

Mitsumori et al., "In Vivo Accuracy of Multisequence MR Imaging for Identifying Unstable Fibrous Caps in Advanced Human Carotid Plaques." *Journal of Magnetic Resonance Imaging*, vol. 17: 410-420, 2003.

Naghavi et al., "From Vulnerable Plaque to Vulnerable Patient, A Call for New Definitions and Risk Assessment Strategies: Part I." *Circulation, Journal of the American Heart Association*: 1664-1672, Oct. 7, 2003.

Naghavi et al., "From Vulnerable Plaque to Vulnerable Patient, A Call for New Definitions and Risk Assessment Strategies: Part II." *Circulation, Journal of the American Heart Association*: 1772-1778, Oct. 14, 2003.

Parker et al., "Improved Efficiency in Double-Inversion Fast Spin-Echo Imaging." *Magnetic Resonance Medicine* vol. 47: 1017-1021, 2002.

Saam et al., "Differences in Carotid Artery Atherosclerotic Lesion Characteristics from the Index- and Non-Index Side of Symptomatic Patients: A High-Resolution, Multi Contrast Magnetic Resonance Imaging Study." *Stroke*: 19pp., 2003.

Saam et al., "In Vivo Comparison of the Atherosclerotic Lesion Ipsilateral and Contralateral to the Side of Symptomatic Carotid Disease: A High-Resolution, Multi-Contrast Magnetic Resonance Imaging Study." *Stroke*: 25pp., 2003.

Saam et al., "Vascular Imaging." *Encyclopedia of Biomaterials and Biomedical Engineering*: 26pp., Oct. 2003.

Schwartz et al., "Molecular Markers, Fibrous Cap Rupture, and the Vulberable Plaque, New Experimental Opportunities." *Circulation, Journal of the American Heart Association*: 471-473, Sep. 14, 2001.

Song et al., "Highly Efficient Double-Inversion Spiral Technique for Coronary Vessel Wall Imaging." *Proceedings of the 10th Annual Meeting of ISMRM*, Honolulu: 1566, 2002.

Song et al., "Multislice Double Inversion Pulse Sequence for Efficient Black-Blood MRI." *Magnetic Resonance Medicine* vol. 47: 616-620, 2002.

Wang et al., "Improved Suppression of Plaque-Mimicking Artifacts in Black-Blood Carotid Atherosclerosis Imaging Using a Multislice Motion-Sensitized Driven-Equilibrium (MSDE) Turbo Spin-Echo (TSE) Sequence." *Magnetic Resonance in Medicine*, vol. 58: 973-978, 2007.

Winn et al., "Detection and Characterization of Atherosclerotic Fibrous Caps with T2-Weighted MR." *AJNR Am J Neuroradiol*, vol. 19: 129-134, 1998.

Xu et al., "Segmentation of Multi-Channel Image with Markov Random Field Based Active Contour Model." *Kluwer Academic Publishers*, The Netherlands: 11pp., 2002.

Yarnykh et al., "High-Resolution Multi-Contrast MRI of the Carotid Artery Wall for Evaluation of Atherosclerotic Plaques." *Current Pro-*

*tocols in Magnetic Resonance Imaging*, Unit A1.4, Intracranial Arterial Disease. Supplement 11: 18pp., 2003.

Yarnykh et al., "Multislice Double Inversion-Recovery Black-Blood Imaging With Simultaneous Slice Reinversion." *Journal of Magnetic Resonance Imaging*, vol. 17: 478-483, 2003.

Yarnykh et al., "$T_1$-Insensitive Flow Suppression Using Quadruple Inversion-Recovery." *Magnetic Resonance in Medicine*, vol. 48: 899-905, 2002.

Yuan et al., "Carotid Atherosclerotic Plaque: Noninvasive MR Characterization and Identification of Vulnerable Lesions." *Radiology*, vol. 221, No. 2: 285-299, Nov. 2001.

Yuan et al., "Carotid atherosclerotic wall imaging by MRI." *Neuroimaging Clinics of North America*, vol. 12: 391-401, 2002.

Yuan et al., "Closed Contour Edge Detection of Blood Vessel Lumen and Outer Wall Boundaries in Black-Blood MR Images." *Magnetic Resonance Imaging*, vol. 17, No. 2: 257-266, 1999.

Yuan et al., "Contrast-Enhanced High Resolution MRI for Atherosclerotic Carotid Artery Tissue Characterization." *Journal of Magnetic Resonance Imaging*, vol. 15: 62-67, 2002.

Yuan et al., "High-Resolution Magnetic Resonance Imaging of Normal and Atherosclerotic Human Coronary Arteries Ex Vivo: Discrimination of Plaque Tissue Components." *Journal of Investigative Medicine*, vol. 49, No. 6: 491-499, Nov. 2001.

Yuan et al., "In Vivo Accuracy of Multispectral Magnetic Resonance Imaging for Identifying Lipid-Rich Necrotic Cores and Intraplaque Hemorrhage in Advanced Human Carotid Plaques." *Circulation, Journal of the American Heart Association*: 2051-2056, Oct. 23, 2001.

Yuan et al, "Identification of Fibrous Cap Rupture With Magnetic Resonance Imaging Is Highly Associated With Recent Transient Ischemic Attack or Stroke." *Circulation, Journal of the American Heart Association*: 181-185, 2002.

Yuan et al., "Measurement of Atherosclerotic Carotid Plaque Size in Vivo Using High Resolution Magnetic Resonance Imaging." *Circulation, Journal of the American Heart Association*: 2666-2671, Dec. 15, 1998.

Yuan et al., "Quantitative Evaluation of Carotid Atherosclerotic Plaques by Magnetic Resonance Imaging." *Current Atherosclerosis Reports 2002*, vol. 4: 351-357, 2002.

Zhang et al., "Comparison of carotid vessel wall area measurements using three difference contrast-weighted black blood MR imaging techniques." *Magnetic Resonance Imaging*, vol. 19: 795-802, 2001.

Zhang et al., "Measurement of Carotid Wall Volume and Maximum Area with Contrast-enhanced 3D MR Imaging: Initial Observations." *Radiology*, vol. 228, No. 1: 200-205, Jul. 2003.

Zhao et al., "Effects of Prolonged Intensive Lipid-Lowering Therapy on the Characteristics of Carotid Artheroscleurotic Plaques In Vivo by MRI, A Case-Control Study." *Arterioscler Thromb Vasc Biol.*: 1623-1629, Oct. 2001.

* cited by examiner

*FIG. 5A* *FIG. 5B*
 
 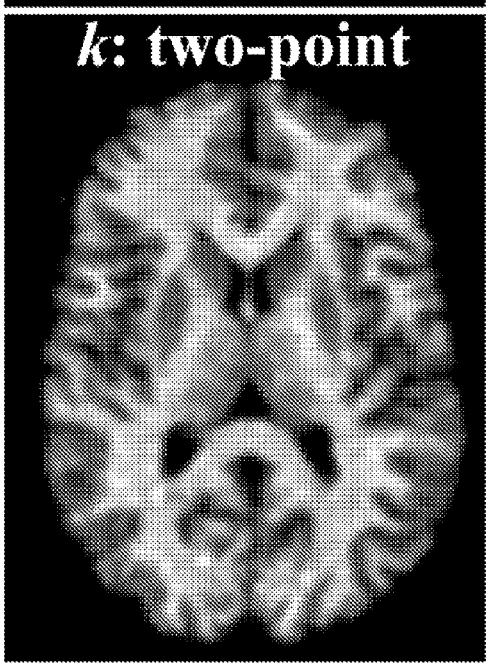
*FIG. 6A* *FIG. 6B*

*FIG. 7A* *FIG. 7B*
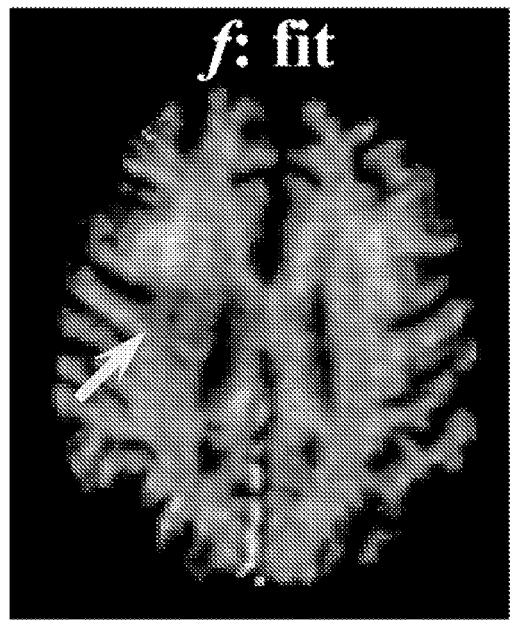 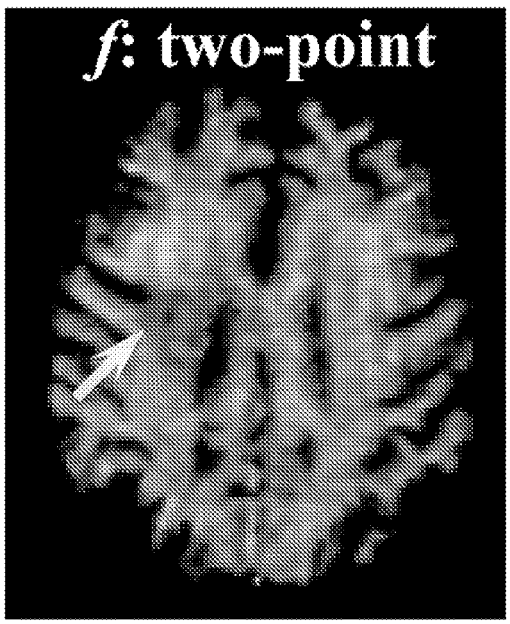
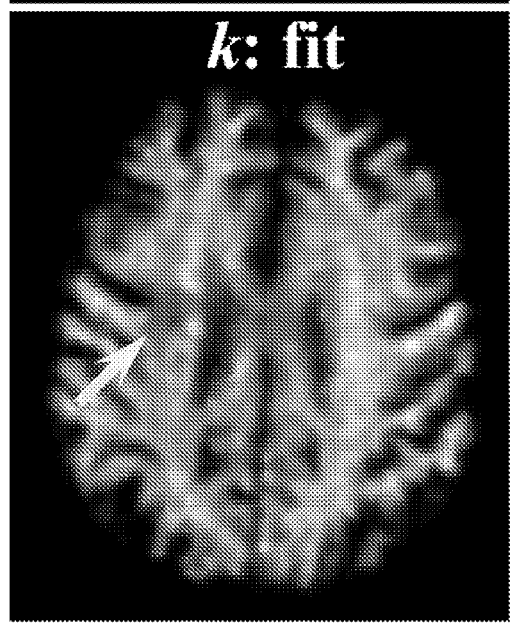 
*FIG. 8A* *FIG. 8B*

FAST TWO-POINT MAPPING OF THE BOUND POOL FRACTION AND CROSS-RELAXATION RATE CONSTANT FOR MRI

RELATED APPLICATIONS

This application is based on a prior copending provisional application Ser. No. 60/938,664, filed on May 17, 2007, the benefit of the filing date of which is hereby claimed under 35 U.S.C. §119(e).

BACKGROUND

One Magnetic Resonance Imaging (MRI) technique for quantitatively characterizing pathological changes in biological tissues is known as magnetization transfer (MT) imaging, which is based on the cross-relaxation effect. Cross-relaxation refers to the process of magnetic exchange between water and macromolecular protons, i.e., between free protons of water molecules and protons that are bound to macromolecules.

More specifically, cross-relaxation is a general magnetic relaxation mechanism, which implies the incoherent magnetization exchange between chemically nonequivalent spins due to dipolar coupling, spin diffusion, and chemical exchange. Cross-relaxation in tissues is typically described within a two-pool model, although more complicated models involve three or four exchangeable fractions. In most cases, the two-pool model provides an adequate description of experimental data and avoids excessive complexity. Within the two-pool model, cross-relaxation is a first-order equilibrium kinetic process involving the mobile water protons (free pool) and the macromolecular protons with restricted motion (bound or semisolid pool).

The protons of macromolecules are generally undetectable using MRI, because the $T_2$ relaxation time of the protons in macromolecules is too short. However, it is possible to employ a magnetization transfer between the protons in macromolecules and the protons associated with free water molecules to detect the protons in macromolecules. The spins of macromolecules exhibit a much greater saturation in response to off-resonance radiofrequency (RF) pulses, than do the spins in free water molecules. The magnetic energy absorbed by protons in the macromolecules can be transferred to the protons in free water molecules. Since the protons in free water molecules have sufficiently long $T_2$ relaxation times to be readily detected, this magnetization transfer process enables MRI to indirectly detect and image the macromolecules and the tissue that they comprise by attenuation of the observed signal.

A phenomenological way of characterizing the efficiency of magnetization transfer is the magnetization transfer ratio (MTR), which is calculated as a relative decrease of the signal intensity caused by off-resonance saturation. MTR is widely used in modern MRI for quantitative tissue characterization. Of the various quantitative MRI methods, MTR imaging has attracted particular attention due to its simple experimental implementation and its ability to provide global tissue characterization. However, MTR has several inherent limitations. In fact, MTR has a complex dependence on all parameters of the two-pool model, while primary factors affecting MTR can be conceptualized in terms of the approximated theory of the pulsed MT effect described in the prior art. These factors are the bound pool fraction (f) the cross-relaxation rate constant (k), and the observed longitudinal relaxation time $T_1$. In the typical conditions of MTR imaging, MTR values are inversely proportional to a weighted sum of two factors: $1/(fT_1)$ and $1/(kT_1)$, and their relative weights depend on pulse sequence parameters. It is clear therefore that: (1) an expected pathological decrease of f and k can be offset by an increase of $T_1$, which will result in a reduced sensitivity of MTR to tissue changes; (2) MTR cannot be consistently interpreted without knowledge of the pathological trends of the parameters f, k, and $T_1$; and, (3) contributions of f, k, and $T_1$ to MTR may vary due to instrumental factors. Another disadvantage of MTR as a biomarker is the difficulty of correcting instrumental errors. It is clear from the theoretical standpoint, and has been shown in experiments, that MTR strongly depends on $B_1$ non-uniformities. Although attempts have been made to introduce empirical $B_1$ correction procedures for MTR measurements, accurate correction is theoretically impossible without the knowledge of all major contributing parameters, specifically f, k, and $T_1$.

Quantitative imaging of fundamental parameters determining the magnetization transfer effect within the two-pool model offers an attractive alternative to traditional MTR measurements, because it provides more information about pathological changes in tissues and allows more rigorous correction of experimental errors. The most comprehensive approach is based on cross-relaxation spectroscopy, or Z-spectroscopy, which employs a series of measurements with a variable offset frequency and saturation power to obtain parameters of the two-pool model (i.e., pool concentrations, exchange rate constant, and intrinsic relaxation times) from the fit of an appropriate mathematical model. The mathematical model of magnetization transfer in tissues has been refined in the prior art by implementing non-Lorentzian line shapes to describe the saturation behavior of macromolecular protons.

A traditional way of performing off-resonance saturation experiments in Z-spectroscopy involves continuous wave (CW) RF saturation, which is not applicable to human in vivo imaging due to specific absorption rate (SAR) limitations. While conventional magnetization transfer (MT) imaging rapidly evolved from CW to a less power-depositing pulsed mode, the absence of an adequate mathematical description precluded in vivo applications of a more accurate Z-spectroscopic approach in combination with the pulsed saturation regime. This problem was resolved in the prior art by incorporating pulsed off-resonance saturation into the two-pool model and by developing a mathematical formalism for data analysis. The feasibility was also demonstrated by the in vivo mapping of cross-relaxation parameters in the human brain using a pulsed MT experimental technique on clinical scanners. These measurements, however, were very time consuming, since they allowed mapping of only one or few slices with the scan time of 40-60 minutes.

An alternative group of cross-relaxation measurement methods is based on the semi-selective instantaneous excitation of either the free or bound pool using various pulse schemes, followed by the observation of bi-exponential longitudinal relaxation. A single-slice technique for mapping only one parameter (macromolecular proton fraction) with an on-resonance preparative sequence combining stimulated echo and inversion was demonstrated in vivo on the human brain. Recently, the feasibility of mapping the exchange rate and bound pool fraction based on an inversion-recovery experiment has been shown in animal imaging. Although these techniques enable single-slice scans in a reasonable time, when combined with the anatomical coverage required for clinical examinations of the whole organ (for example, the brain), their time performance becomes prohibitive for clinical use.

Practical applications of the above cross-relaxation mapping methods in clinical studies are difficult or even impossible due to a number of limitations, such as a long examination time, insufficient anatomic coverage (particularly for single-slice techniques), and a large slice thickness (typically 5-7 mm). These problems were mostly overcome by employing a newer cross-relaxation imaging method that is based on using four MT-weighted images for map reconstruction, which produces maps of key parameters of the two-pool model, specifically f and k. It is important to note that this method enables considerable improvement of parametric map quality compared to previous approaches, which resulted in maps of a generally poor quality, with a high noise level, and a lack of visualization of anatomical details. Nevertheless, further improvement in time efficiency is highly desirable, since this method, which currently provides the best time performance, requires about 25 minutes for whole-brain mapping.

A common limitation of the existing methods is the time-consuming measurements resulting from the need to use serial images to reconstruct parametric maps by applying mathematical fitting procedures. Therefore, existing methods are impractical for use in timely diagnosing patients in a clinical environment. An alternative method for direct algebraic calculation of the parametric k and f maps based upon as few as two experimental measurements would therefore clearly be desirable, since it should greatly reduce the time needed to achieve meaningful and useful information about the brain. As a next step in cross-relaxation imaging technology, the development of a simple two-point reconstruction method should greatly improve time efficiency.

SUMMARY

In contrast to the two prior art studies discussed above, a two-point reconstruction technique has been developed that is able to achieve much better time efficiency without compromising the quality of resulting parametric maps. Due to these advantages, the two-point reconstruction method can achieve a better spatial resolution, and therefore, detect finer details of tissue damage. In serial clinical research (for example in therapy trials), this method can provide a higher statistical power due to a better resolution and a larger spatial coverage. The two-point reconstruction method can also improve patients' comfort during MRI examinations by avoiding the relatively long scan time required for quantitative cross-relaxation imaging using conventional techniques that are known in the prior art.

The two-point reconstruction technique represents a significant new quantitative imaging approach that can be used as a source of clinically relevant information. The parameters f and k provide new potential biomarkers with expected sensitivity to different aspects of tissue pathology. Specifically, the biological relevance of cross-relaxation parameters to macromolecular tissue composition in the brain described in the prior art indicates that this method will better depict differences between axonal loss and demyelination than existing quantitative MRI methods. The macromolecular fraction f can be a sensitive and specific surrogate marker of the axonal density, while the cross-relaxation rate constant k should mostly reflect changes in the myelination of axons. This understanding is supported by observations in healthy subjects, which demonstrated an increase of f in brain regions containing dense fiber bundles corresponding to anatomically known tracts and a selective increase of k in the corticospinal tract associated with the size of axons.

In its methodological aspect, two-point reconstruction technique provides a time-efficient, highly informative, and robust quantitative imaging tool for various applications, such as degenerative, vascular, and neoplastic diseases of the central nervous system, neurodevelopment, and brain connectivity research, and numerous diseases of internal organs. With a clinically reasonable scan time the method generates three independent whole-brain quantitative maps for comprehensive tissue characterization (f, k, and $T_1$). In contrast to conventional MTR imaging, the two-point method can eliminate almost all instrumentation errors, since rigorous $B_0$ and $B_1$ correction procedures can readily be implemented.

More specifically, one aspect of the two-point reconstruction technique is directed toward a method for efficiently determining spatial distribution images of a macromolecular proton fraction and a cross-relaxation rate constant in a biological object. The method comprises the steps of producing a first and a second magnetic resonance (MR) image, with magnetization transfer contrast and producing a reference MR image without magnetization transfer contrast. Another step provides for calculating a first and a second saturation rate respectively corresponding to the first and second MR images. A $T_1$ map is produced for the spatial distribution of the longitudinal relaxation time in the object. Spatial distribution images of the bound pool fraction and the cross-relaxation rate constant are determined based on the first and second MR images, the reference MR image, the first and second saturation rates, and the $T_1$ map. In this exemplary approach, additional magnetic resonance images are not required to construct the bound pool fraction and the cross-relaxation rate constant spatial distribution images. Consequently, the time required to produce the spatial distribution images of the biological object is substantially reduced. The method also includes the steps of measuring the first signal intensity at a first measurement point and the second signal intensity at a second measurement point. Included within these steps are the steps of predefining variables that are characteristic of a saturated radio frequency (RF) pulse.

Another aspect of this technology is directed to a two-point reconstruction method for producing parametric maps of an object containing water and macromolecules. It includes the steps of causing a magnetization transfer effect to take place between free protons of water and a bound protons of macromolecules at a first and a second measurement point. Another step includes determining a first signal intensity based on the first measurement point, and a second signal intensity based on the second measurement point. Yet another step includes computing two values of a linear variable based on the first and second signal intensities followed by constructing spatial distribution images of a bound pool fraction and a cross-relaxation rate constant in an efficient and timely manner.

Still another aspect of the technology is directed toward a method for simultaneous measurement of spatial distributions of a macromolecular proton fraction and a cross-relaxation rate constant in an object by magnetic resonance imaging. The method includes the step of acquiring a first MR image using a pulse sequence with an off-resonance saturation; a second MR image using a pulse sequence with a different off-resonance saturation; a reference MR image using a pulse sequence without off-resonance saturation; and a plurality of MR images for use in determining longitudinal relaxation times in the object. A spatial distribution of the longitudinal relaxation times in the object is then determined. Other steps include determining a first and a second saturation rate corresponding to the first and the second MR images produced using the pulse sequence with off-resonance saturations and producing images of the spatial distributions of the macromolecular proton fraction and the cross-relaxation rate constant in the object based on the first and second MR images; the image of the spatial distribution of the longitudinal relaxation times; and the first and second saturation rates. The method also includes an intermediate step that comprises calculation of a first and a second intermediate value such that these intermediate values define a linear function of a saturation rate.

Another aspect of the two-point reconstruction technique is directed to a system for producing spatial distribution images of a bound pool fraction and a cross-relaxation rate constant in a biological object. The system includes a magnetic resonance imaging apparatus adapted for producing magnetic resonance images (MR images) of the biological object and for causing the magnetization transfer effect to take place. A controller is coupled to the MRI apparatus to control it. The controller carries out a plurality of functions, including producing a first MR image and a second MR image of the biological object; approximating a plurality of linear functions corresponding to the first and second MR images; and, determining the spatial distribution images of the bound pool fraction and the cross-relaxation rate constant based on the plurality of linear functions. Again, in connection with this system, an additional series of MR images is not required to construct the bound pool fraction and the cross-relaxation rate constant spatial distribution images, which substantially reduces the time required to produce the parametric images of the biological object.

Another aspect of this invention is directed toward a two-point measurement method for determining a bound pool fraction and a rate constant of magnetic cross-relaxation between a bound pool and a free pool in an object containing at least two pools of magnetic nuclei with substantially different mobility. This method comprises the steps of detecting a first nuclear magnetic resonance (NMR) signal after applying a first radiofrequency saturation, detecting a second NMR signal after applying a second radiofrequency saturation, and measuring a longitudinal relaxation time $T_1$. The method further comprises normalization of the first NMR signal and the second NMR signal to a reference signal and computation of a first and a second saturation rate of the bound pool from a predefined power and offset frequency of the first and the second radiofrequency saturation using a predefined transverse relaxation time of the bound pool. Additionally, a first and a second saturation rate of the free pool are calculated from the power and the offset frequency of the first and the second radiofrequency saturation using a predefined transverse relaxation time of the free pool. Yet another step includes computing a first and a second value of a linear variable based on the normalized NMR signals, saturation rates, and the longitudinal relaxation time $T_1$ such that the said variable defines a substantially linear function of the saturation rate of the bound pool. During the final step, the bound pool fraction and the rate constant of magnetic cross-relaxation in the object are computed based on the first value of the linear variable, the second value of the linear variable, the first saturation rate of the bound pool, the second saturation rate of the bound pool, and the longitudinal relaxation time $T_1$.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein:

FIG. 5A illustrates a parametric f map obtained from a healthy subject and reconstructed by the non-linear least square fitting (NLSF) method;

FIG. 5B illustrates a parametric f map obtained from a healthy subject and reconstructed by the two-point reconstruction technique;

FIG. 6A illustrates a parametric k map obtained from a healthy subject and reconstructed by the NLSF method;

FIG. 6B illustrates a parametric k map obtained from a healthy subject and reconstructed by the two-point reconstruction technique;

FIG. 7A illustrates a parametric f map obtained from a cerebrovascular disease (CVD) subject and reconstructed by the NLSF method;

FIG. 7B illustrates a parametric f map obtained from a CVD subject and reconstructed by the two-point reconstruction technique;

FIG. 8A illustrates a parametric k map obtained from a CVD subject and reconstructed by the NLSF method;

FIG. 8B illustrates a parametric k map obtained from a CVD subject and reconstructed by the two-point reconstruction technique;

DESCRIPTION

Figure 1:
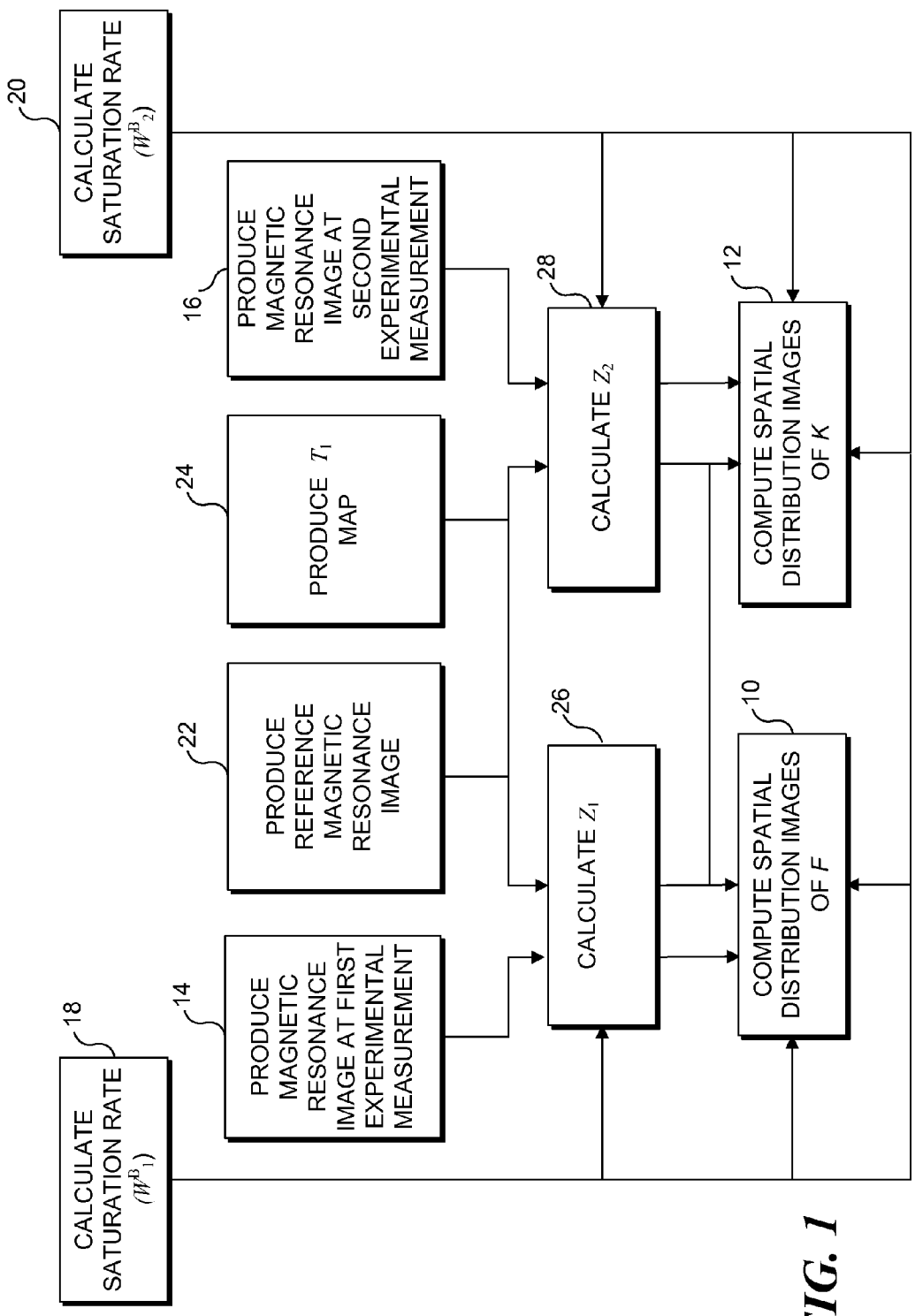
FIG. 1 is a flowchart of the overall steps of an exemplary embodiment of the two-point reconstruction technique.

Figures and Disclosed Embodiments are not Limiting

Exemplary embodiments are illustrated in referenced Figures of the drawings. It is intended that the embodiments and Figures disclosed herein are to be considered illustrative rather than restrictive. No limitation on the scope of the technology and of the claims that follow is to be imputed to the examples shown in the drawings and discussed herein.

Utility

The efficiency of the two-point reconstruction technique in producing equivalent images to provide quantitative tissue characterization, as compared with earlier methods, is particularly relevant to its applicability as a clinically usable technique, because it can produce useful cross-relaxation parametric maps in a much shorter time than previous methods. For example, three-dimensional (3-D) maps of the cross-relaxation rate constant and the bound pool fraction of the entire human brain with isotropic spatial resolution of 1.5-2 mm can be produced in approximately 10-15 minutes using a typical 1.5T clinical scanner, as compared to approximately 25 minutes required by the technique with the best performance known from the prior art. It has the potential to be used in the fields of systemic brain diseases, for example, in monitoring the effect of treatment for multiple sclerosis, and can be of particular interest for imaging tumors and tumor environments because it is specifically sensitive to the changes produced in tissue when a patient is taking specific drugs since the images produced can highlight quantitative differences in tissues affected by disease. It also has potential to be applied to neuropsychiatric studies in which there is an interest in quantitative characterization of brain connectivity. It is also expected that the two-point reconstruction technique will provide quality images indicative of the changes in brain architecture, such as changes in fiber density, and in myelin sheathes around nerves. In the event that a patient is not immobile during a period of clinical examination, some scans included in the acquisition procedure may suffer from motion artifacts or be mis-registered to each other. Identification of corrupted data is difficult in quantitative imaging, since the quality of parametric images can be estimated only after time-consuming reconstruction. In contrast to the prior art, the present novel technique can be implemented with real-time reconstruction of parametric maps, during a patient examination, to facilitate quality control of the final result. Correspondingly, in this technique, any corrupted image can readily be recaptured without inconvenience to the patent, since the duration of individual scans is only about 2-3 minutes. Finally, by reducing a spatial coverage of the technique and targeting it to a specific region of the body, ultrafast data acquisition can be achieved such that parametric imaging can be performed within one breath-hold interval (e.g., 20-30 seconds). This method is of critical importance for avoiding artifacts in quantitative imaging of organs, which are subjected to motion during a respiratory cycle, such as liver, kidney, and pancreas. For such organs, quantitative measurements of the parameters related to macromolecular composition, such as the cross-relaxation rate constant and the bound pool fraction, can provide unique diagnostic and prognostic information in conditions that result in substantial changes in macromolecular organization of tissues. Examples of these conditions include but are not limited to liver fibrosis, renal fibrosis, polycystic kidney disease, diabetes, and pancreatic necrosis.

Thus, it should also be understood that this clinically usable technique is applicable to many subjects or objects, including, but not limited to a human, an animal, tissue, an organ, or a bodily fluid. In addition, the term "organ" is not meant to be limiting and should be considered to be applicable to almost any type of organ, such as a brain, a spinal cord, a liver, a kidney, a pancreas, a muscle, skin, and bone marrow, to name a few types by way of example, without any intended limitation.

Exemplary Method Steps

The overall steps of an exemplary embodiment of this method are illustrated in FIG. 1. In order to compute spatial distribution images of f as shown in a step 10 and spatial distribution images of k as shown in a step 12, it is necessary to take two experimental measurements, $S_{mt1}$ and $S_{mt2}$. These experimental measurements are the signal intensity referenced below in Equation 1. These two experimental measurements are linearized in order to obtain spatial distribution maps, as reflected in Equations 1, 2, and 3, which is believed to be novel, since it has not previously been understood that the parametric f and k maps, as shown by the examples in FIGS. 5B, 6B, 7B, and 8B, can be calculated using only two points.

A step 14 provides for the production of a magnetic resonance image at the first experimental measurement, $S_{mt1}$. The details of this step are explained below in connection with FIG. 2. A step 16 similarly provides for the production of a magnetic resonance image at the second experimental measurement, $S_{mt2}$. The details of this step are explained below in connection with FIG. 3. It is also necessary to calculate the saturation rate of the first and second experimental measurements, as indicated in a step 18 and a step 20. The details of these steps are discussed below in connection with FIGS. 2 and 3. In addition, it is necessary to produce a reference magnetic resonance image, as indicated in a step 22. The details of this step are discussed below in connection with FIG. 4. Furthermore, it is necessary to produce an image of the spatial distribution of $T_i$ also known to those of ordinary skill in the art of MRI as a $T_1$ map, as indicated in a step 24. In one exemplary embodiment, the variable flip-angle method known from the prior art is used to produce a $T_1$ map. Alternatively, other $T_1$ mapping methods commonly known to one skilled in the prior art can be used for this purpose. Once these steps are completed, as indicated in steps 26 and 28, a $Z_1$ value and a $Z_2$ value is produced. These values are intermediate calculation variables that are introduced for simplicity, as shown by Equation 2, below. After these steps have been performed, the results from all of these steps are used to calculate the spatial distribution images of f and k, as indicated in steps 10 and 12, respectively. Examples of these spatial images of the parametric f and k maps, are illustrated in FIGS. 5B, 6B, 7B, and 8B.

As is commonly known to anyone skilled in the art of magnetic resonance image processing, parametric maps which are also referred to as spatial distribution images of a parameter comprise picture elements (commonly referred to as "pixels") that each have an intensity (or some other characteristic) equal to values of a corresponding parameter, for example $T_1$, k, or f. To reconstruct a parametric map, computations are typically performed on a pixel-by-pixel basis, thereby repeatedly applying appropriate calculation formulas or algorithms to each pixel of source images to calculate each pixel of a resulting map. Unless otherwise stated, the terms "producing", "determining", or "constructing" as applied to parametric maps or spatial distribution images herein refer to a standard pixel-by-pixel computation procedure, wherein each pixel value is obtained as a result of appropriate mathematical calculations performed on pixel values of source images.

Figure 2:
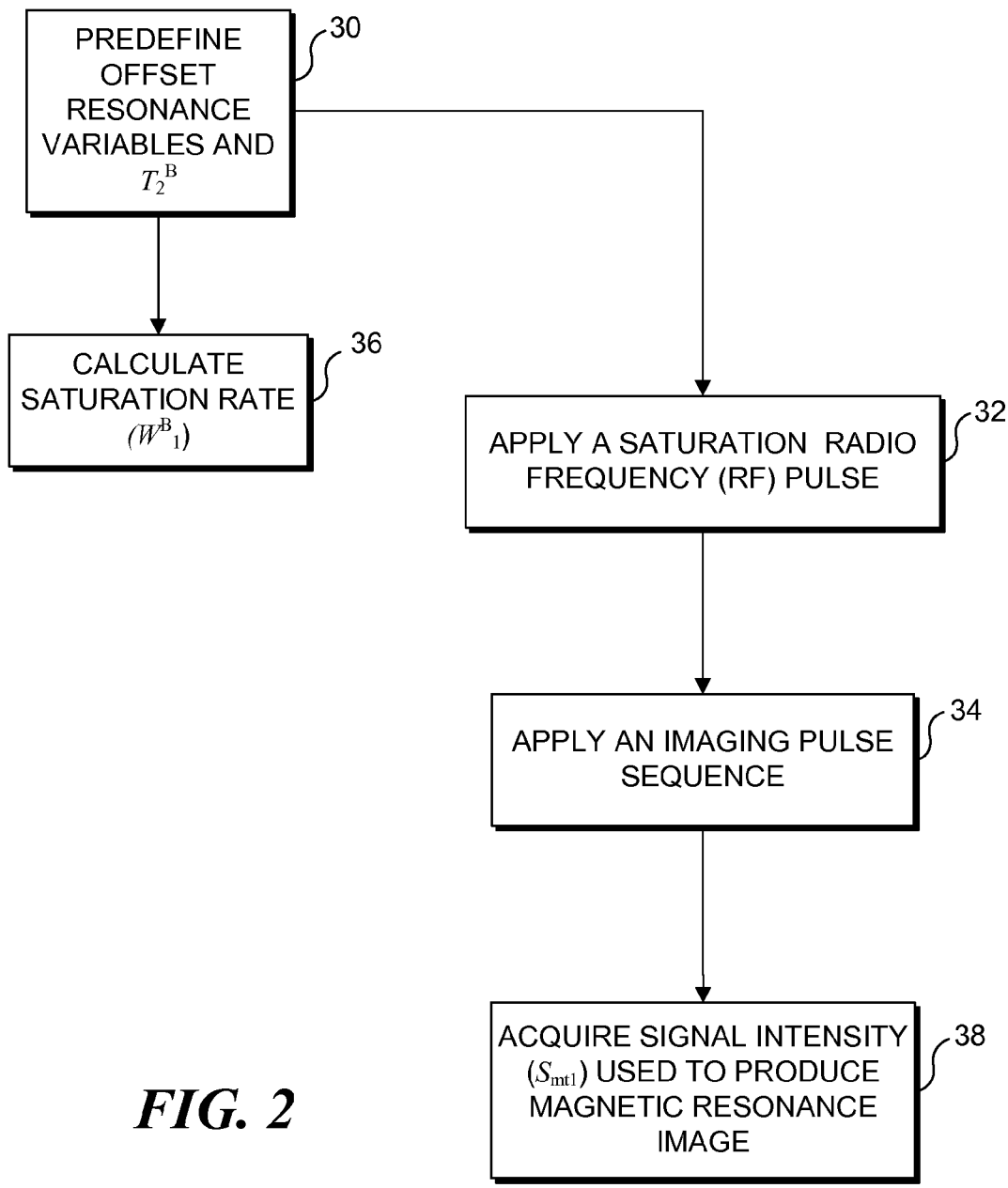
FIG. 2 is a flowchart of the steps performed to produce a magnetic resonance image acquired at the first experimental measurement.

More specifically, FIG. 2 illustrates the steps involved to produce a magnetic resonance image used for the first experimental measurement by acquiring the signal intensity for the first point. Using the full matrix equation for the pulsed MT in the two-pool system and applying the first-order approximation to exponential matrix terms, the equation for the signal acquired with the off-resonance MT-prepared spoiled gradient echo (MT-SPGR) sequence can be presented as:

$$S_{mt} \approx \frac{M_0(1-f)(A + R_1^F \tau W^B)\sin\alpha \exp(-TE/T_2^*)}{A + (R_1^F + k)\tau W^B +} \quad [1]$$
$$(R_1^B + k(1-f)f^{-1} + \tau W^B)(\tau W^F - TR^{-1}\ln\cos\alpha)$$

where the indices "F" and "B" refer to the free and bound pool of protons, respectively; $M_0$ is the total equilibrium magnetization; $R_1^{F,B}$ are the longitudinal relaxation rates; $A = R_1^F R_1^B + R_1^F k (1-f)/f + R_1^B k$; $W^{F,B}$ are the effective saturation rates; $\alpha$ is the flip angle of the readout pulse; TR is repetition time, TE is the echo time, $T_2^*$ is the effective transverse relaxation time in the presence of magnetic field inhomogeneity, and $\tau = t_{mt}/TR$ is the duty cycle of the MT saturation pulse with the duration $t_{mt}$.

Off-resonance behavior of the signal is determined by the saturation rates, which depend on the line shapes g of the corresponding pools: $W^{F,B} = \pi\omega_{1rms}^2 g^{F,B}(\Delta, T_2^{F,B})$, where $\omega_{1rms}$ is the root-mean-square amplitude, and $\Delta$ is the offset frequency of the saturation pulse. As is commonly known to one skilled in the prior art, the Lorentzian and super-Lorentzian shapes are assumed for the free and bound pool, respectively. However, it should be understood that any other mathematical functions describing line shapes can be used in carrying out exemplary embodiments of the present novel approach. Thus, to acquire the signal intensity for Equation 1, as shown in a step 30, it is necessary to predefine certain variables, which are characteristic for a saturation RF pulse applied. These variables are an offset frequency and a power level determined by an amplitude of a pulse to be employed to saturate the magnetization of an object. In a step 32, an RF pulse is generated such that it saturates the macromolecules of the object at the offset frequency, causing the magnetization transfer effect to take place. The term "object" is used herein to encompass a tissue or an organ of an organism, or a whole organism, or a sample of any material. In a step 34, a regular imaging pulse sequence consisting of a series of RF and magnetic field gradient pulses is generated to excite and spatially encode a signal to be employed to produce an image. In an exemplary embodiment, a spoiled gradient echo sequence (SPGR) was used, although other MRI pulse sequences supplied by equipment manufacturers can alternatively be used in the context of the described method. It also should be understood that an imaging pulse sequence can be designed for two-dimensional (2-D) or 3-D signal acquisition. It should further be understood that the method can be combined with data acquisition by means of a pulse sequence designed for nuclear magnetic resonance (NMR) spectroscopy. As is well known to those of ordinary skill in magnetic resonance physics, Equation 1 can be used to describe the signal behavior in ether imaging or spectroscopic experiment without loss of generality. Within the spectroscopic approach, a signal can be acquired either from a localized volume within the object by using an appropriate localization sequence or from the whole object. It should also be understood that equipment used for carrying out the exemplary embodiment can be tuned to detect a signal from any nuclei that can produce an NMR signal and be involved in the magnetization transfer effect. Examples of such nuclei include (but are not limited to) protons ($^1H$), deuterium ($^2H$), fluorine-19 ($^{19}F$), phosphorus-31 ($^{31}P$), and carbon-13 ($^{13}C$). In a step 38, the signal intensity that obeys Equation 1 can be acquired for the first experimental measurement point and is used to reconstruct the first magnetic resonance image. In addition, in a step 36, a first saturation rate value is calculated based on the predefined variables of step 30, and on a predefined value of the transverse relaxation time ($T_2^B$) of macromolecular protons, which is fairly constant in biological materials.

Figure 3:
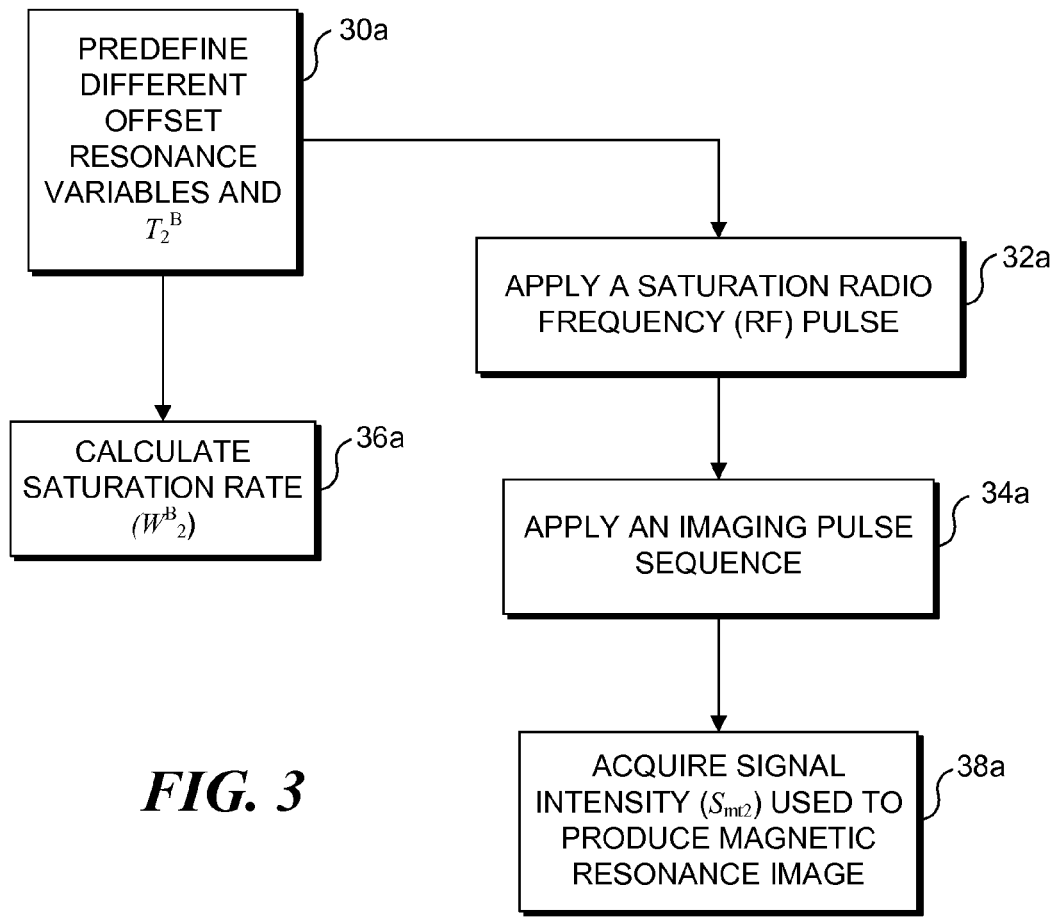
FIG. 3 is a flowchart of the steps performed to produce a magnetic resonance image acquired at the second experimental measurement.

FIG. 3 illustrates the repetition of this process to produce the second magnetic resonance image acquired at the second experimental measurement point. The steps are similar to those in FIG. 2, except that a different variable is predefined in a step 30a than the variable that was used to produce the first experimental measurement point. In an exemplary embodiment, such a variable is the offset frequency, and an RF pulse in a step 32a is generated such that it saturates the object at the different offset frequency value. As an alternative, an amplitude, and, correspondingly, the power level of an RF pulse can be a variable that is changed between steps 32 and 32a. Both the offset frequency and amplitude are accounted for by a calculated saturation rate, and therefore, these variables can alternatively be used in the experimental design without loss of generality. For example, an offset frequency can be used to saturate the biological object, followed by the use of a different offset frequency. In the alternative, an offset frequency can be used to saturate the biological object, followed by the use of a different power level, instead of varying the offset frequency. In a step 34a, the same imaging pulse sequence as in a step 34 is applied for generating a signal. In a step 38a, the signal intensity that obeys Equation 1 is acquired for the second experimental measurement and is used to reconstruct the second magnetic resonance image. In addition, in a step 36a, a second saturation rate value is calculated based on the different predefined variables of step 30a.

Figure 4:
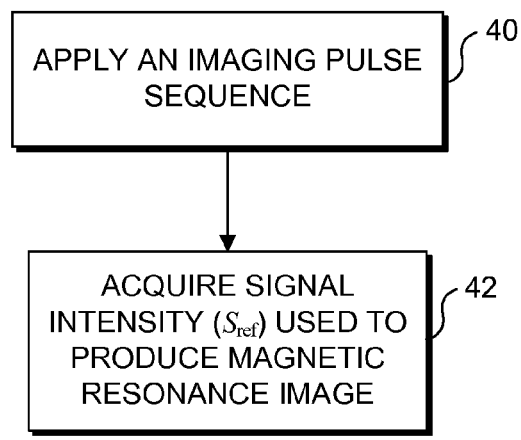
FIG. 4 is a flowchart of the steps performed to produce a reference magnetic resonance image.

FIG. 4 is a flowchart of exemplary steps performed to produce a reference magnetic resonance image for use in Equation 2. A reference image is obtained without applying a saturation RF pulse by using the same imaging pulse sequence as that used in steps 34 and 34a, which is exemplified in a step 40. In a step 42, a signal is acquired, and the reference magnetic resonance image is reconstructed. It also should be understood that a reference image can be computed without actual signal acquisition, if a variable flip-angle method is used for obtaining a $T_1$ map and a complementary proton density map, by using a spoiled gradient echo sequence with the same TE, as is known in the art.

Once image acquisition is completed such that the first image with signal intensities $S_{mt1}$ (see step 38 of FIG. 2), the second image with signal intensities $S_{mt2}$ (see step 38a of FIG. 3), the reference image with signal intensities $S_{ref}$ (see step 42 of FIG. 4), and the $T_1$ map (see step 24 of FIG. 1) are stored in the memory of a computer or other storage, a linear approximated model of the MT effect is used to reconstruct maps of the bound pool fraction (f) and cross-relaxation rate constant (k) of an object. More specifically, the quantity Z can be defined as, $$Z = \frac{S_{mt}t_{mt}(W^B - W^F) - (S_{ref} - S_{mt})\ln\cos\alpha}{(S_{ref} - S_{mt})(R_1 TR - \ln\cos\alpha) - S_{mt}t_{mt}W^F} \quad [2]$$

where $R_1^F \approx R_1^B \approx R_1 = 1/T_1$. Based on the assumptions that $R_1^B \ll k/f$ and $|TR^{-1} \ln(\cos\alpha)| \ll k/f$, Z is an approximately linear function of the variable $t_{mt}TR^{-1}W^B$ with coefficients $k^{-1}$ and $f^1 + R_1 k^{-1}$:

$$Z \approx f^{-1} + R_1 k^{-1} + k^{-1} t_{mt} TR^{-1} W^B. \quad [3]$$

As follows from Equation 3, parameters f (step 10 of FIG. 1) and k (step 12 of FIG. 1) can be calculated from two measurements of Z ($Z_1$ (see step 26 of FIG. 1)) and $Z_2$ (see step 28 of FIG. 1)) corresponding to two MT-weighted signal intensities ($S_{mt1}$ (see step 38 of FIG. 2)) and $S_{mt2}$ (see step 38a of FIG. 3)) obtained at two values of the saturation rate $W^B_{1,2}$ (see steps 18 and 20 of FIG. 1):

$$k \approx t_{mt} TR^{-1}(W_1^B - W_2^B)/(Z_1 - Z_2) \quad [4]$$

$$f \approx (W_1^B - W_2^B)/[Z_2(W_1^B + t_{mt}^{-1} TRR_1) - Z_1(W_2^B + t_{mt}^{-1} TRR_1)]. \quad [5]$$

The $W^B$ values can be calculated for experimental $\omega_{1rms}$ and $\Delta$ with a uniform parameter $T_2^B$, which is approximately 11 μs in brain tissues and has a small variability, as known from the prior art. It should be understood that different predetermined values of $T_2^B$ also can be used in the exemplary embodiment, if found appropriate for an object. If both measurements are taken sufficiently far from the resonance value ($\Delta > 2$ kHz), $W^F$ is small and can be approximated as $W^F \approx (\omega_{1rms}/2\pi\Delta)^2 R_1/0.055$. It should also be understood that the use of this approximation in the exemplary embodiment does not impose any limitations on the exact calculation of $W^F$ based on a predefined value of the parameter $T_2^F$ in an object.

Experimental Results

Whole-brain images were acquired on a 1.5 T MR scanner (General Electric Company, Signa™ MR scanner) with a transmit-receive head coil using the 3D MT-SPGR sequence. Four MT-weighted scans were acquired with TR/TE=32/2.4 ms, $\alpha=10°$, $\omega_{1rms}=1557$ Hz (single-lobe-sync MT pulse with $t_{mt}=14$ ms and an effective flip angle of 950°), and variable $\Delta=3, 6, 9,$ and 12 kHz. A reference image was obtained with the same sequence parameters and without MT saturation. $T_1$ relaxometry was performed by the variable flip angle technique using the 3D SPGR sequence with TR/TE=20/2.4 ms, at $\alpha=4, 10, 20,$ and 30°. All data were acquired with actual resolution of 1.4×2.3×2.8 mm and zero-interpolated before performing a Fourier transform to obtain an isotropic voxel size of 1.4 mm. The scan time was 3 min for MT-weighted scans and 2 min for variable flip angle scans.

To compare the two-point reconstruction technique to the previously described conventional non-linear least-square fitting (NLSF) method that uses four points, the same $T_1$ map and reference scan were used. It is to be noted that the variable flip-angle method is only one technique for relaxation measurements and that alternative methods could be based on relaxation delay, for example, when implementing the two-point reconstruction technique. The NLSF reconstruction employed all of the MT-SPGR data, while for the two-point reconstruction technique, only the offset points for $\Delta=3$ kHz and 9 kHz were chosen as the first and second experimental measurements. In other exemplary embodiments, different frequencies may be used for the offset points, as well as different saturation pulse amplitudes. Data were obtained from five healthy volunteers (three male, two female, all within the age range of 25-49 years), and from one cerebrovascular disease (CVD) patient (male, age 75 years) with a history of stroke and right carotid artery occlusion. For all subjects, parametric histograms were calculated and normalized to the total number of voxels used in the images.

The tissue contrast and appearance of anatomical structures were very similar on NLSF (e.g., FIGS. 5A, 6A, 7A, and 8A) images and the images produced by the two-point reconstruction technique (e.g., FIGS. 5B, 6B, 7B, and 8B). It is noticeable that both fitted and two-point f maps reveal a specific type of contrast sensitive to fiber tracts; this contrast related to fiber tracts is described in the prior art. Both k (FIGS. 8A and 8B) and f (FIGS. 7A and 7B) maps also reveal the sensitivity to pathological changes, as seen on the exemplary images from the CVD patient with an ischemic infarct. Notice a post-infarct lesion in the right centrum semiovale (indicated by the arrows), with an inhomogeneous decrease of k and f visible on all maps in FIGS. 7A, 7B, 8A, and 8B.

Figure 9A:
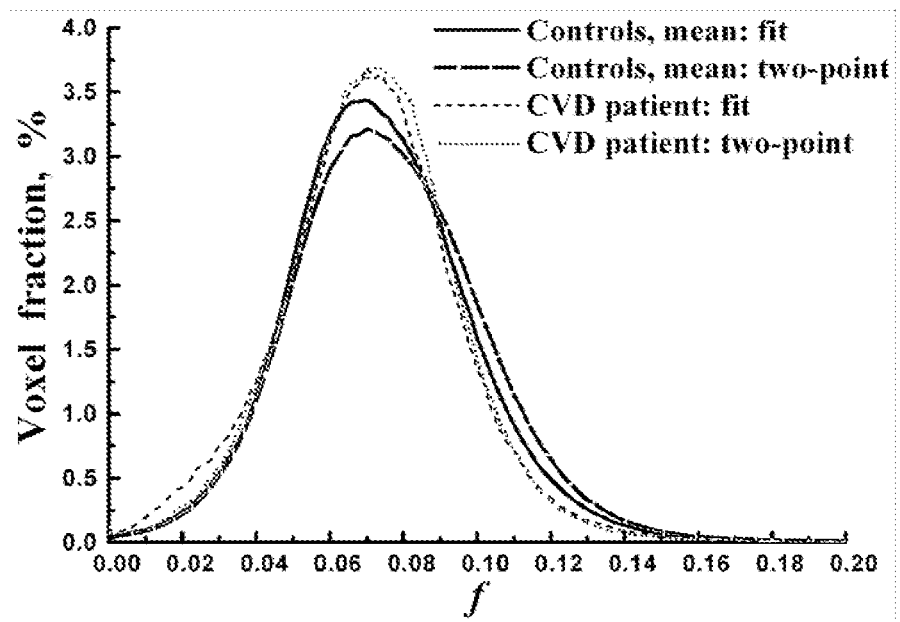
FIG. 9A illustrates normalized whole-brain histograms for the parameter f corresponding to the maps reconstructed by NLSF and two-point reconstruction techniques.
Figure 9B:
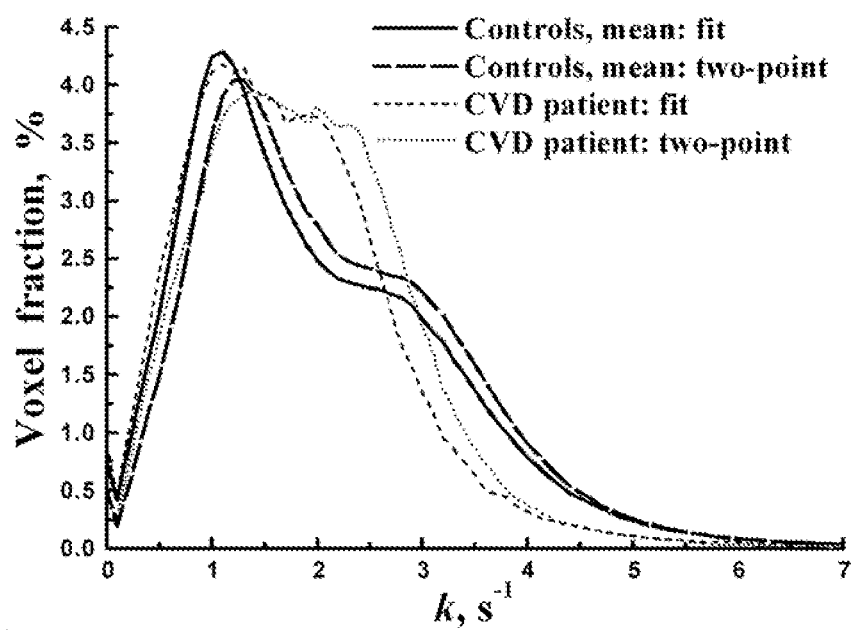
FIG. 9B illustrates normalized whole-brain histograms for the parameter k corresponding to the maps reconstructed by NLSF and two-point reconstruction techniques.

Quantitative comparison between the two reconstruction techniques is illustrated by parametric histograms in FIGS. 9A and 9B. The group histograms for healthy subjects (solid lines and long dashed lines) and individual histograms for the CVD patient (short dashed lines and dotted lines) are presented. The histograms from the two-point reconstruction technique represent similar shapes and close quantitative values, although a minor bias is visible. The k histograms of the CVD patient show the apparent change in shape, as compared to healthy controls, which is consistent with systemic brain atrophy and an altered proportion between white and gray matter.

System for Implementing the Present Invention

Figure 10:
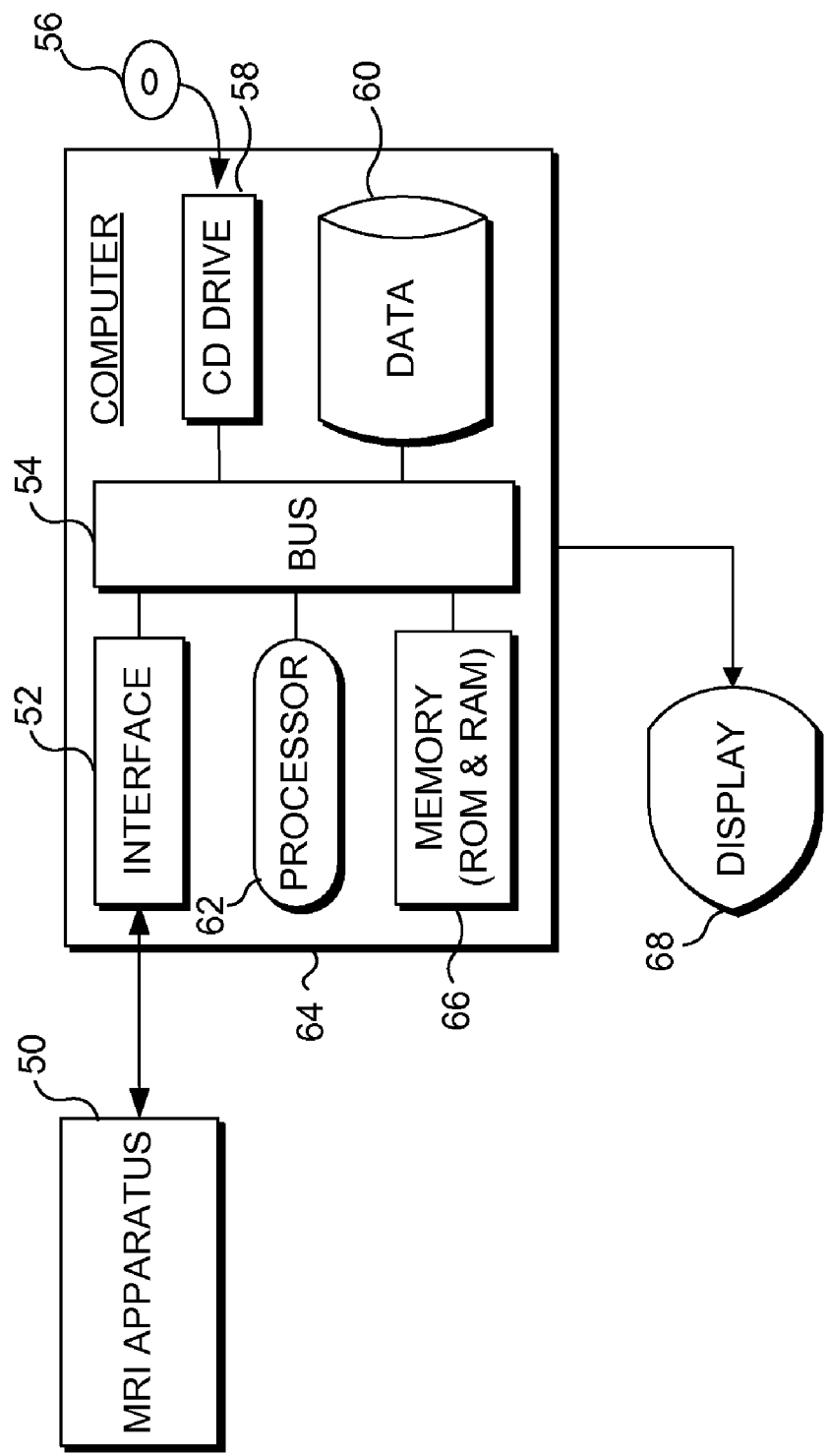
FIG. 10 is a block diagram illustrating an exemplary embodiment of a system used to produce the two-point reconstruction technique.

FIG. 10 schematically illustrates an exemplary system suitable for implementing the present invention. The system includes a generally conventional MRI apparatus 50 that is controlled by a computer 64. Computer 64 may be a generally conventional personal computer (PC), a dedicated controller specifically intended for controlling MRI apparatus 50. It will be understood that some other form of programmable or hardwired logic device that is configured to control implementation of the steps comprising the present novel approach described herein might be used instead of computer 64. Although not shown, MRI apparatus 50 includes a magnet to create a permanent magnetic field, a plurality of gradient coils to produce spatial variations of a magnetic field, and RF transceiver and receiver systems to transmit and receive RF signals to and from a plurality of RF coils, as will be well known to those of ordinary skill in the art of MRI. Accordingly, details of the MRI apparatus need not be and are not specifically illustrated or discussed herein.

Computer 64 is coupled to a display 68, which is used for displaying MRI images to an operator. Included within computer 64 is a processor 62. A memory 66 (with both read only memory (ROM) and random access memory (RAM)), a non-volatile storage 60 (such as a hard drive or other non-volatile data storage device) for storage of data, digital signals, and software programs, an interface 52, and an optical drive 58 are coupled to processor 62 through a bus 54. Optical drive 58 can read a compact disk (CD) 56 (or other optical storage media) on which machine instructions are stored for implementing the present invention and other software modules and programs that may be run by computer 64. The machine instructions are loaded into memory 66 before being executed by processor 62 to carry out the steps of the present invention.

Operation of MRI apparatus 50 is controlled by computer 64 when processor 62 executes the machine instructions stored in memory 66. These machine instructions cause the processor to implement the different pulse sequences applied in the method to the object and to acquire the signal. The resulting signals are optionally stored on storage 60 so that selected images can be displayed on display 68, or directly displayed. It is also noted that the machine instructions will cause processor 62 to determine the appropriate predefined variables, so as to ensure that magnetization of the object is saturated at an appropriate offset frequency.

Conclusions

The two-point reconstruction technique represents a simple and time-efficient approach for quantitative imaging of cross-relaxation parameters in vivo. The method provides a reasonable trade-off between complicated multi-point fit techniques and simple but physically meaningless traditional MTR measurements. With an optimized protocol combining two-point MT acquisition (see step 38 of FIG. 2 and step 38a of FIG. 3), a reference scan (see step 42 of FIG. 4), and fast $T_1$-relaxometric imaging (see step 24 of FIG. 1), whole-brain data acquisition can be accomplished within 10-15 minutes, and thus can be easily implemented in real time or near real time in a number of clinical protocols. This capability enables the diagnosis of a disease in the clinical environment by enabling abnormal values of either the macromolecular proton fraction or the cross-relaxation rate constant to be determined and quickly compared to normal values. In addition, it can be shown how effective the treatment of a disease is, by monitoring changes of these parameters over a period of a treatment time.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention in which an exclusive right is claimed is defined by the following:

1. A method for efficiently determining spatial distribution images of a macromolecular proton fraction and a cross-relaxation rate constant, in a biological object, comprising the steps of:
   (a) producing a first and a second magnetic resonance (MR) image with magnetization transfer contrast characterized by a first and a second signal intensity;
   (b) producing a reference MR image without magnetization transfer;
   (c) calculating a first and a second saturation rate respectively corresponding to the first and second MR images;
   (d) producing a $T_1$ map for the spatial distribution of the longitudinal relaxation time of the biological object; and
   (e) determining said spatial distribution images of the macromolecular proton fraction and the cross-relaxation rate constant based on said first and second MR images, said reference MR image, said first and second saturation rates, and said $T_1$ map, such that additional magnetic resonance images are not required to construct the macromolecular proton fraction and the cross-relaxation rate constant spatial distribution images, thereby substantially reducing a time required to produce the spatial distribution images of the macromolecular proton fraction and the cross-relaxation rate constant in the biological object.

2. The method of claim 1, wherein the step of producing the first and second MR images with magnetization transfer contrast comprises the steps of applying a first sequence of radiofrequency (RF) pulses and measuring the first signal intensity at a first measurement point and applying a second sequence of RF pulses and measuring the second signal intensity at a second measurement point.

3. The method of claim 2, wherein the step of applying the first sequence of RF pulses at the first measurement point comprises the step of applying a first saturating RF pulse characterized by a first predefined variable, said first predefined variable being selected from the group consisting of:
   (a) an offset frequency of the RF pulse; and
   (b) a power of the RF pulse.

4. The method of claim 3, wherein the step of applying the second sequence of RF pulses at the second measurement point comprises the step of applying a second saturating RF pulse characterized by a second predefined variable, said second predefined variable being assigned a value that is substantially different from a value of the first predefined variable for the first saturating RF pulse at the first measurement point, said second predefined variable being selected from the group consisting of:
   (a) the offset frequency of the RF pulse; and
   (b) the power of the RF pulse.

5. The method of claim 2, wherein the step of applying the first sequence of RF pulses comprises the step of generating a saturating radio frequency (RF) pulse using a predefined variable for the first point, said RF pulse being directed at the biological object such that the magnetization of macromolecules in the biological object is partially saturated, thereby causing a magnetization transfer effect to take place between free protons of water molecules and protons that are bound to macromolecules of the biological object.

6. The method of claim 2, wherein the step of applying the second sequence of RF pulses comprises the step of generating another saturating RF pulse at a different predefined variable for the second point, said other RF pulse being directed at the biological object such that the magnetization of macromolecules in the biological object is partially saturated to a different degree, thereby causing a magnetization transfer effect of a different magnitude to take place between free protons of water molecules and protons that are bound to macromolecules of the biological object.

7. The method of claim 1, wherein the step of producing the first and the second MR images comprises the step of generating an imaging pulse sequence.

8. The method of claim 7, wherein the imaging pulse sequence includes a spoiled gradient echo sequence.

9. The method of claim 7, wherein the imaging pulse sequence produces either a two-dimensional MR image or a three-dimensional MR image.

10. The method of claim 1, wherein the step of producing the reference MR image comprises the steps of applying a sequence of radiofrequency pulses and measuring a reference signal intensity.

11. The method of claim 1, wherein the step of producing the reference MR image comprises the step of computing a reference signal intensity from predetermined spatial distributions of a proton density and a longitudinal relaxation time $T_1$ in the biological object.

12. The method of claim 1, wherein the step of producing the $T_1$ map comprises the step of employing a variable flip-angle method to produce an image of the spatial distribution of $T_1$.

13. The method of claim 1, further comprising the step of calculating a first and a second intermediate value, said first and second intermediate values defining a linear function of the first saturation rate and the second saturation rate.

14. The method of claim 13, further comprising the steps of determining a plurality of coefficients from the first intermediate value, the second intermediate value, the first saturation rate, and the second saturation rate; and, determining the macromolecular proton fraction and the cross-relaxation rate constant from said plurality of coefficients.

15. The method of claim 1, wherein the biological object is at least one biological object selected from the group of biological objects consisting of:
   (a) a human subject;
   (b) an animal;
   (c) a tissue;
   (d) an organ; and
   (e) a body fluid.

16. The method of claim 15, wherein the organ is at least one organ selected from the group of organs consisting of:
(a) a brain;
(b) a spinal cord;
(c) a liver;
(d) a kidney;
(e) a pancreas;
(f) a muscle; and
(g) a bone marrow.

17. A two-point magnetic resonance image reconstruction method for producing parametric maps of an object including water and macromolecules, comprising the steps of:
(a) causing a magnetization transfer effect to take place between free protons of water and bound protons of macromolecules at a first and a second measurement point;
(b) determining a first signal intensity based on said first measurement point, and a second signal intensity based on said second measurement point;
(c) computing a first value of a linear variable based on the first signal intensity, and a second value of said linear variable based on the second signal intensity, such that said first and second values of said linear variable define a linear function of a saturation variable; and
(d) constructing spatial distribution images of a bound pool fraction and a cross-relaxation rate constant, based on results of the step of computing, in an efficient and timely manner.

18. The method of claim 17, wherein the linear variable is a predefined mathematical function of a signal intensity, a longitudinal relaxation time, a transverse relaxation time of bound protons, a transverse relaxation time of free protons, a proton density, a repetition time of a pulse sequence, a flip angle of an excitation pulse, a power of a saturation pulse, a frequency of the saturation pulse, and a duration of the saturation pulse.

19. The method of claim 17, wherein the saturation variable is a predefined mathematical function of a transverse relaxation time of bound protons, a repetition time of a pulse sequence, a power of the saturation pulse, a frequency of the saturation pulse, and a duration of the saturation pulse.

20. A method for simultaneous measurement of spatial distributions of a macromolecular proton fraction and a cross-relaxation rate constant in an object by magnetic resonance imaging, comprising the steps of:
(a) acquiring:
  (i) a first magnetic resonance (MR) image using a pulse sequence with a first off-resonance saturation;
  (ii) a second MR image using a pulse sequence with a second off-resonance saturation that is different from the first off-resonance saturation;
  (iii) a reference MR image using a pulse sequence without off-resonance saturation; and
  (iv) a plurality of MR images for use in determining longitudinal relaxation times in the object;
(b) determining a spatial distribution of the longitudinal relaxation times in the object;
(c) determining a first and a second saturation rate corresponding to the first and the second MR images produced using the pulse sequence with the first off-resonance saturation and the second off-resonance saturation; and
(d) producing images of the spatial distributions of the macromolecular proton fraction and the cross-relaxation rate constant in the object based on:
  (i) said MR images;
  (ii) said image of the spatial distribution of the longitudinal relaxation times; and
  (iii) said first and second saturation rates.

21. The method of claim 20, wherein the step of producing images comprises the step of calculating a first intermediate value and a second intermediate value, said first intermediate value and second intermediate value defining a linear function of a saturation rate.

22. The method of claim 20, further comprising the step of calculating the macromolecular proton fraction and the cross-relaxation rate constant from a plurality of coefficients of the linear function of the first saturation rate and the second saturation rate.

23. The method of claim 22, wherein the step of calculating comprises the step of determining the coefficients from the first intermediate value, the second intermediate value, the first saturation rate, and the second saturation rate.

24. The method of claim 20, wherein the step of acquiring said first and second MR images includes the step of predefining a power and an offset frequency of the first off-resonance saturation and the second off-resonance saturation.

25. The method of claim 20, wherein said first and second saturation rates are a function of a power level and an offset frequency and a predefined value of a transverse relaxation time of the macromolecular proton.

26. A system for producing spatial distribution images of a bound pool fraction and a cross-relaxation rate constant in a biological object, comprising:
(a) a magnetic resonance imaging (MRI) apparatus adapted for producing magnetic resonance (MR) images of the biological object and for causing a magnetization transfer effect to take place; and
(b) a controller coupled to the MRI apparatus to control it, said controller carrying out a plurality of functions, including:
  (i) producing a first MR image, a second MR image, and a reference MR image of the biological object;
  (ii) approximating a plurality of linear functions corresponding to said first and second MR images; and
  (iii) determining said spatial distribution images of the bound pool fraction and the cross-relaxation rate constant based on said plurality of linear functions, such that an additional series of MR images is not required to construct the bound pool fraction and the cross-relaxation rate constant spatial distribution images, thereby substantially reducing the time required to produce the spatial distribution images of the bound pool fraction and the cross-relaxation rate constant in the biological object.

27. The system of claim 26, wherein the controller further measures a signal intensity at a first measurement point and at a second measurement point in the biological object.

28. The system of claim 27, wherein the controller measures the signal intensity at the first measurement point by selecting a predefined variable that is characteristic of a saturating radio frequency (RF) pulse, said predefined variable being selected from a group of variables consisting of:
(a) an offset frequency of the RF pulse; and
(b) a power level of the RF pulse.

29. The system of claim 28, wherein the controller measures the signal intensity at the second measurement point by:
(a) selecting a different offset frequency; or
(b) selecting a different power level.

30. The system of claim 26, wherein the MRI apparatus generates a saturating radio frequency (RF) pulse using a predefined variable to measure a signal intensity at a first measurement point, said RF pulse being directed at the biological object such that the magnetization of macromolecules in the biological object is partially saturated, thereby causing a magnetization transfer effect to take place between free protons of water molecules and protons that are bound to macromolecules of the biological object.

31. The system of claim 30, wherein the MRI apparatus generates another saturating RF pulse at a different predefined variable, said other RF pulse being directed at the biological object such that the magnetization of macromolecules in the biological object is partially saturated to a different magnitude, thereby causing a magnetization transfer effect of the different magnitude to take place between the free protons of water molecules and the protons that are bound to the macromolecules of the biological object.

32. The system of claim 26, wherein the MRI apparatus generates an imaging pulse sequence.

33. The system of claim 32, wherein the imaging pulse sequence includes a spoiled gradient echo sequence.

34. The system of claim 32, wherein the imaging pulse sequence produces either a two-dimensional image or a three-dimensional image.

35. The system of claim 26, wherein the controller further measures a reference signal intensity.

36. The system of claim 26, wherein the controller further computes a reference signal intensity from predetermined spatial distributions of a proton density and a longitudinal relaxation time $T_1$ in the biological object.

37. The system of claim 26, wherein the MRI apparatus generates a $T_1$ map.

38. The system of claim 26, wherein the controller calculates a plurality of intermediate values describing a magnetization transfer (MT) effect in the biological object.

39. A two-point measurement method for determining a bound pool fraction and a rate constant of magnetic cross-relaxation between a bound pool and a free pool in an object containing at least two pools of magnetic nuclei with substantially different mobility, comprising the steps of:
  (a) applying a first radiofrequency (RF) saturation with a first predefined power and a first predefined frequency;
  (b) detecting a first nuclear magnetic resonance (NMR) signal produced after applying the first RF saturation;
  (c) applying a second RF saturation with a second predefined power and a second predefined frequency such that either the second predefined power or the second predefined frequency is substantially different from the first predefined power or the first predefined frequency, respectively;
  (d) detecting a second NMR signal produced after applying the second RF saturation;
  (e) measuring a longitudinal relaxation time $T_1$ of the object;
  (f) determining a reference NMR signal;
  (g) computing a first saturation rate of the bound pool from the first predefined power, the first predefined frequency, and a predefined transverse relaxation time of the bound pool;
  (h) computing a second saturation rate of the bound pool from the second predefined power, the second predefined frequency, and the predefined transverse relaxation time of the bound pool;
  (i) computing a first saturation rate of the free pool from the first predefined power, the first predefined frequency, and a predefined transverse relaxation time of the free pool;
  (j) computing a second saturation rate of the free pool from the second predefined power, the second predefined frequency, and the predefined transverse relaxation time of the free pool;
  (k) computing a first value of a linear variable that is an algebraic function of the first normalized NMR signal, the reference NMR signal, the first saturation rate of the bound pool, the first saturation rate of the free pool, and the longitudinal relaxation time $T_1$, such that said linear variable is a substantially linear function of a saturation rate of the bound pool;
  (l) computing a second value of said linear variable that is an algebraic function of the second normalized NMR signal, the reference NMR signal, the second saturation rate of the bound pool, the second saturation rate of the free pool, and the longitudinal relaxation time $T_i$; and
  (m) computing the bound pool fraction and the rate constant of magnetic cross-relaxation in the object based on the first value of the linear variable, the second value of the linear variable, the first saturation rate of the bound pool, the second saturation rate of the bound pool, and the longitudinal relaxation time $T_1$.

40. The method of claim 39, wherein the magnetic nuclei are protons.

41. The method of claim 39, wherein the bound pool comprises protons of macromolecules, and the free pool comprises protons of water.

42. The method of claim 39, wherein the steps of detecting the first NMR signal, and detecting the second NMR signal each comprises the step of applying a spectroscopic pulse sequence targeted to at least one of the objects selected from the group of objects consisting of:
  (a) the object; and
  (b) a predefined volume within the object.

43. The method of claim 39, wherein the steps of detecting the first NMR signal and the second NMR signal comprise the steps of applying a magnetic resonance imaging (MRI) pulse sequence; reconstructing a first image of the object with a plurality of pixel intensities modulated by the first NMR signal; and, reconstructing a second image of the object with a plurality of pixel intensities modulated by the second NMR signal.

44. The method of claim 39, wherein the step of measuring a longitudinal relaxation time $T_1$ employs a $T_1$ mapping method, that includes producing an image of the object comprising pixel intensities equal to local $T_i$ values.

45. The method of claim 40, further comprising the step of repeating steps (k), (l), and (m) for each pixel of an image of the object, thereby producing the image of the object comprising pixel intensities equal to local values of the bound pool fraction, and producing another image of the object comprising pixel intensities equal to local values of the rate constant of magnetic cross-relaxation.

46. The method of claim 39, wherein the image is either a two-dimensional image, or a three-dimensional image.

47. The method of claim 39, wherein the step of determining the reference NMR signal comprises the step of experimentally measuring the reference NMR signal.

48. The method of claim 39, wherein the step of determining the reference NMR signal comprises the step of computing the reference NMR signal from a proton density and a longitudinal relaxation time $T_1$ of the object.

49. The method of claim 40, further comprising the step of selecting the first predefined power, the first predefined frequency, the second predefined power, and the second predefined frequency such that the first saturation rate of the free pool and the second saturation rate of the free pool are substantially close to zero, thereby substantially simplifying the steps of computing the first value of the linear variable, and the second value of the linear variable.

50. A method for efficiently determining a macromolecular proton fraction and a cross-relaxation rate constant, in a biological object, for use in a clinical environment, comprising the steps of:

(a) producing a first magnetic resonance (MR) image with a magnetization transfer contrast characterized by a first signal intensity, and a second MR image with a magnetization transfer contrast characterized by a second signal intensity;

(b) producing a reference MR image without magnetization transfer;

(c) calculating a first saturation rate, and a second saturation rate respectively corresponding to the first MR image, and the second MR image;

(d) producing a $T_1$ map for a spatial distribution of a longitudinal relaxation time of the biological object; and (e) determining the macromolecular proton fraction, and the cross-relaxation rate constant based on said first and second MR images, said reference MR image, said first and second saturation rates, and said $T_1$ map, such that additional magnetic resonance images are not required to construct the macromolecular proton fraction and the cross-relaxation rate constant, to aid in diagnosing a disease by detecting abnormal values of either the macromolecular proton fraction or the cross-relaxation rate constant in the biological object.

51. The method of claim 50, further comprising the step of evaluating an effect of a treatment of a disease by monitoring changes of either the macromolecular proton fraction or the cross-relaxation rate constant during a treatment period.

* * * * *